United States Patent
Palmer et al.

(10) Patent No.: US 9,368,172 B2
(45) Date of Patent: Jun. 14, 2016

(54) READ STROBE GATING MECHANISM

(71) Applicant: Rambus Inc., Sunnyvale, CA (US)

(72) Inventors: Robert E. Palmer, Chapel Hill, NC (US); Barry W. Daly, Chapel Hill, NC (US); William F. Stonecypher, Chapel Hill, NC (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/572,674

(22) Filed: Dec. 16, 2014

(65) Prior Publication Data

US 2015/0221354 A1    Aug. 6, 2015

Related U.S. Application Data

(60) Provisional application No. 61/935,105, filed on Feb. 3, 2014.

(51) Int. Cl.
*G11C 7/00* (2006.01)
*G11C 7/22* (2006.01)

(52) U.S. Cl.
CPC .................................. *G11C 7/22* (2013.01)

(58) Field of Classification Search
CPC ............................................. G11C 7/22
USPC ..................... 365/193, 194, 189.15
See application file for complete search history.

(56) References Cited

U.S. PATENT DOCUMENTS

| | | | | |
|---|---|---|---|---|
| 6,600,681 B1 * | 7/2003 | Korger | ............... | G11C 7/1066 365/193 |
| 6,785,189 B2 * | 8/2004 | Jacobs | ............... | G11C 7/1066 365/193 |
| 7,117,382 B2 * | 10/2006 | Khieu | ............... | G06F 5/06 327/161 |
| 7,126,874 B2 * | 10/2006 | Lin | ............... | G11C 7/1006 365/189.05 |
| 7,177,230 B1 * | 2/2007 | Huang | ............... | G11C 7/1066 365/193 |
| 7,215,584 B2 * | 5/2007 | Butt | ............... | G06F 13/4059 365/193 |
| 7,289,374 B2 | 10/2007 | Partsch | | |
| 7,345,933 B1 * | 3/2008 | Telem | ............... | G06F 13/28 327/141 |
| 7,664,978 B2 * | 2/2010 | Burney | ............... | G06F 1/10 711/100 |
| 7,675,811 B2 * | 3/2010 | Amarilio | ............... | G11C 7/10 365/193 |
| 7,685,393 B2 * | 3/2010 | Gillingham | ......... | G06F 13/4243 365/233.14 |
| 7,908,507 B2 * | 3/2011 | Ogura | ............... | G11C 7/02 365/189.15 |
| 7,911,857 B1 | 3/2011 | Venkataraman et al. | | |
| 8,098,535 B2 | 1/2012 | MacLaren et al. | | |
| 8,228,747 B2 * | 7/2012 | Onishi | ............... | G11C 7/1066 365/191 |
| 8,315,114 B2 * | 11/2012 | Lin | ............... | G06F 13/1689 365/193 |
| 8,432,754 B2 * | 4/2013 | Iwasaki | ............... | G11C 8/18 365/189.06 |
| 8,504,788 B2 * | 8/2013 | Stott | ............... | G11C 7/02 365/193 |
| 8,742,791 B1 * | 6/2014 | Shimanek | ......... | H03K 19/17736 326/41 |
| 8,743,635 B2 * | 6/2014 | Kizer | ............... | G06F 13/1689 365/193 |
| 9,001,599 B2 * | 4/2015 | Swanson | ............ | G06F 13/1689 365/191 |
| 9,047,927 B2 * | 6/2015 | Takai | ............... | G11C 7/04 |
| 2011/0299346 A1 | 12/2011 | Fung et al. | | |
| 2013/0033946 A1 | 2/2013 | Ware et al. | | |

\* cited by examiner

*Primary Examiner* — Viet Q Nguyen
(74) *Attorney, Agent, or Firm* — Fenwick & West LLP

(57) ABSTRACT

A memory controller that extends the window when reading data from the memory device to compensate for fluctuations in a read strobe delay. The memory controller includes a communication port that receives a timing reference signal for reading data from a memory device. A control circuit generates a gating signal indicative of a read window. A gating adjustment circuit generates an adjusted gating signal indicative of an adjusted read window based on the gating signal and the timing reference signal. A gating circuit generates a first gated timing reference signal for reading data by gating a delayed version of the timing reference signal with the adjusted gating signal.

20 Claims, 3 Drawing Sheets

READ STROBE GATING MECHANISM

CROSS-REFERENCE TO RELATED APPLICATION

This application claims priority from U.S. Provisional Patent Application No. 61/935,105, titled "Read Strobe Gating Mechanism" and filed on Feb. 3, 2014, the contents of which are incorporated by reference herein in its entirety.

BACKGROUND

When reading data from a memory device, a memory controller attempts to estimate a window of time when data read from the memory device is valid. However, the read data strobe (DQS) phase relative to clock (CK) is highly variable and is subject to both low frequency and high frequency fluctuations. This variability makes it difficult to predict when to open and close the window.

BRIEF DESCRIPTION OF THE DRAWINGS

The teachings of the embodiments herein can be readily understood by considering the following detailed description in conjunction with the accompanying drawings.

DETAILED DESCRIPTION OF EMBODIMENTS

Embodiments of the present disclosure relate to a memory controller that extends the window for reading data from the memory device to compensate for variations in a read strobe delay. The memory controller includes a communication port that receives a timing reference signal (e.g., data strobe signal) for reading data from a memory device. A control circuit generates a gating signal indicative of an initial read window. A gating adjustment circuit generates an adjusted gating signal indicative of an adjusted read window based on the gating signal and the timing reference signal. A gating circuit generates a gated timing reference signal for reading data by gating a delayed version of the timing reference signal with the adjusted gating signal. Portions of the delayed timing reference signal within the adjusted read window are passed onto the gated timing reference signal, whereas other portions of the delayed timing reference signal outside of the adjusted read window are prevented from being passed onto the gated timing reference signal. By using the adjusted read window to control gating of the delayed timing reference signal, the initial read window can be inaccurate without causing the memory controller to read in spurious strobe edges or invalid data.

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

Figure 1:
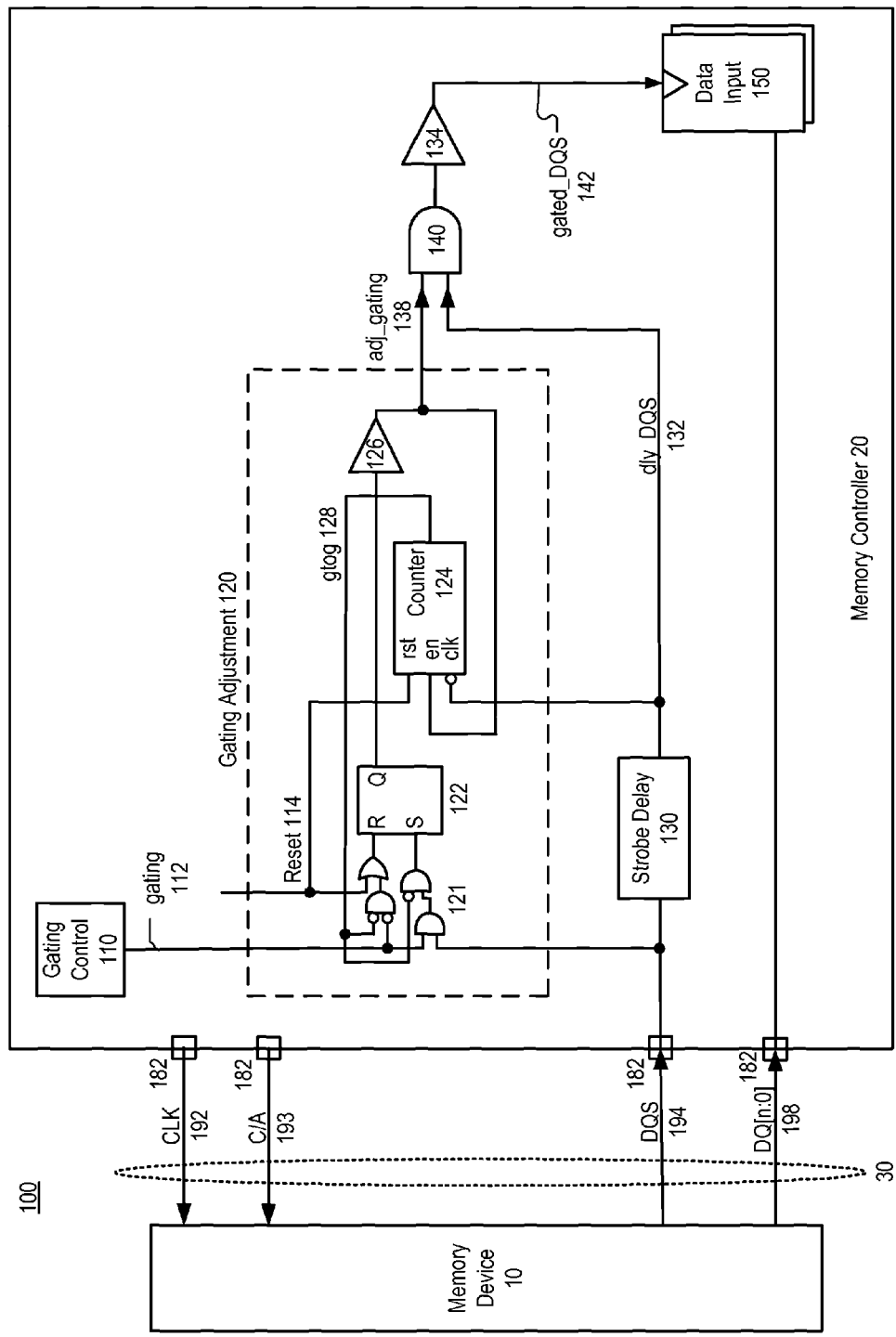
FIG. 1 is a memory system that compensates for temperature and voltage fluctuations, according to an embodiment.

FIG. 1 is a memory system 100 that compensates for temperature and voltage fluctuations, according to an embodiment. The memory system 100 includes a memory device 10 and memory controller 20 interconnected via a communication link 30. In one embodiment, the memory controller 20 is an integrated circuit (IC) that is capable of controlling the memory device 10. Examples of a memory controller 20 include a central processing unit (CPU), a graphics processing unit (GPU), a system on chip (SoC), a bridge, etc. The memory device 10 may be an IC that stores data under the control of the memory controller 20. The memory device 10 may store the data in dynamic random access memory (DRAM), non-volatile memory (NVM), or other types of memory. In other embodiments there may be more than one memory device 10 controlled by the memory controller 20.

The memory controller 20 is coupled to the communication link 30 through one or more communication ports 182, such as IC pins of the memory controller 20. The memory controller 20 transmits to and receives signals from the communication link 30 through the communication ports 182. The signals transmitted across the communication link 30 can be single ended signals or differential signals.

When reading data from the memory device 10, the memory controller 20 generates one or more read request commands that are transmitted to the memory device 10 as command/address (C/A) signals 193. The read request commands specify a particular address in the memory device 10 that data is to be read from. The memory controller 20 also transmits a clock signal 192 that is used by the memory device 10 in reading the read request command and controlling timing of signals output by the memory device 10.

The memory device 10 responds to the read request commands, after a brief delay, by transmitting data via the data (DQ) signals 198 and transmitting a read data strobe (DQS) signal 194 for use as a timing reference in reading the DQ signals 198. There are multiple DQ signals 198 (e.g., bits [n:0]) for each DQS signal 194. The DQS signal 194 includes several strobe edges that are equal to the burst length of the data transaction. Each strobe edge represents a transition from one logic level to another logic level (e.g., low to high, or high to low). DQS signal 194 is used in a double data rate (DDR) manner such that both the rising and falling edges of the DQS signal are used as timing references for reading data. The DQ signals 198 may be edge aligned with the strobe edges of the DQS signal 194 as is the case in lower power DDR3 (LPDDR3) systems. DQS signal 194 is an example of a timing reference signal, and in other embodiments different timing reference signals may be used in place of the DQS signal 194 and the timing reference signals may not be DDR signals.

The memory controller 20 includes a gating control circuit 110, a gating adjustment circuit 120, a strobe delay circuit 130, a strobe gating circuit 140, and a data input circuit 150. The gating control circuit 110 estimates a window of time during which the data information (e.g., data and data strobe) transmitted by the memory device 10 is valid and can be read, which may be referred to herein as a read window. The gating control circuit 110 then generates a gating signal 112 that indicates the start and end of the initial read window. To determine the initial read window, the gating control circuit 110 performs read strobe training by tracking the delay between a rising CLK 192 edge for a read request command and the arrival of a first strobe edge of the DQS signal 194. The cause of the delay can be logically divided into two parts: read latency (RL) of the memory device 10 and a skew between the outgoing CLK signal 192 and incoming DQS signal 194 (tDQSCK). This delay is used to adjust the phase of the initial read window during normal operation of the memory controller 20.

The gating adjustment circuit 120 adjusts the initial read window into an adjusted version of the initial read window. In specific, the gating adjustment circuit 120 receives the gating signal 112, the DQS signal 194, the delayed DQS signal 132, and the reset signal 114. The gating adjustment circuit 120 uses these input signals to generate an adjusted gating signal 138 that is asserted at the beginning of an adjusted read window and de-asserted at the end of the adjusted read window. The adjusted read window of the adjusted gating signal 138 can then be used to gate the delayed DQS signal 132. As shown, the gating adjustment circuit 120 includes combinational logic 121, a SR latch 122, a counter circuit 124, and a distribution buffer 126.

A problem with the initial read window estimated by the gating control circuit 110 is that it only compensates for low frequency drift in the delay between the read request command and the first strobe edge of the DQS signal 194. The initial read window is not entirely accurate due to factors which introduce high frequency drift in the delay between the read request command and the first strobe edge of the DQS signal 194. If the read window starts too early relative to the first strobe edge, it causes trash data to be read into the memory controller 20. Similarly, if the read window ends before the last strobe edge, it can cause some valid data to be missed. The adjusted read window generated by gating adjustment circuit 120 helps extend the read window to compensate for potential problems caused by high frequency variations in the delay, as will be explained herein.

Two conditions cause the gating adjustment circuit 120 to assert the adjusted gating signal 138 to start the adjusted read window. First, the gating signal 112 must be asserted to indicate the beginning of the initial read window. Second, the DQS signal 194 must be asserted, which indicates that a first strobe edge has arrived. Once these conditions are satisfied, the combinational logic 121 sets the SR latch 122. The output of the SR latch 122 then asserts the adjusted gating signal 138 accordingly.

Two conditions cause the gating adjustment circuit 120 to de-assert the adjusted gating signal 138 to end the adjusted read window. First, the gating signal 112 must be de-asserted to indicate the end of the initial read window. Second, a pre-determined number of strobe edges corresponding to a target burst length (e.g. four edges, eight edges) must be detected in the delayed DQS signal 132. The counter circuit 124 is responsible for counting the number of rising and falling strobe edges of delayed DQS signal 132. The counter circuit 124 is enabled by the adjustable gating signal 138. When enabled, the counter circuit 124 asserts the gate toggle signal 128. The counter circuit 124 receives the delayed DQS signal 132 and counts the strobe edges of the delayed DQS signal 132. Once a number of strobe edges corresponding to a target burst length is reached, the counter circuit 124 de-asserts the gate toggle signal 128 to indicate that a pre-determined number of edges delayed DQS signal 132 has been detected. In other embodiments, strobe edges may be counted starting with the first falling strobe edge subsequent to the assertion of the adjustable gating signal 138. In other embodiments, the counter circuit 124 may only count rising or falling strobe edges, but not both.

The counter circuit 124 may generate a logic low pulse on gate toggle signal 128 for every minimum burst length interval (e.g., once every four bit burst). In one embodiment, the counter circuit 124 can receive a burst adjustment signal (not shown) that is used to adjust the number of strobe edges counted by the counter circuit 124. This allows the counter circuit 124 to generate the logic low pulse at different minimum burst length intervals. However, as will be explained by FIGS. 3A and 3B, it is not strictly necessary to adjust the number of counted strobe edges for the counter circuit 124 to work with different burst lengths. The counter circuit 124 is also reset by the reset signal 114. In some embodiments, the reset signal 114 is asserted between read transactions. The detailed operation of the strobe adjustment circuit 120 will be discussed in greater detail by reference to FIGS. 2A, 2B, 3A and 3B.

The strobe delay circuit 130 receives the DQS signal 194 and generates a delayed DQS signal 132 that is a delayed version of the DQS signal 194. The strobe delay circuit 130 introduces a delay between the DQS signal 194 and the delayed DQS signal 132, which establishes an extension of the effective read gate window. In other embodiments, strobe delay circuit 130 may be one element of a more elaborate delay mechanism used to establish an optimal strobe insertion delay. For example, there may be controllable delay elements in the strobe path in addition to the strobe delay circuit 130 that are used during read eye training to establish the optimal strobe delay relative to data. In one embodiment, the strobe delay circuit 130 can introduce a delay of 0.5 unit intervals (UI) or more to achieve a 0.5 UI extension of the read gate window. A UI refers to the amount of time corresponding to a single transmitted data bit, and can be the time between adjacent strobe edges in DDR system.

The gating circuit 140 receives the adjusted gating signal 138 and the delayed DQS signal 132. The gating circuit 140 uses the adjusted gating signal 138 to gate the delayed DQS signal 132 and generate a gated DQS signal 142. The distribution buffer 134 may also be used to generate the gated DQS signal 142 with enough drive strength so that it can be used to drive one or more data input circuits 150. Portions of the delayed DQS signal 132 falling outside of the adjusted read window do not affect the gated DQS signal 142, while portions of the delayed DQS signal 132 falling inside the adjusted read window are reflected in the gated DQS signal 142. When the adjusted read window is properly aligned with the delayed DQS signal 132, the gated DQS signal 142 includes all of the valid strobe edges from the delayed DQS signal 132 while excluding any spurious strobe edges. The gating circuit 140 may be an AND gate or other appropriate gating logic.

In one embodiment, the gated DQS signal 142 is provided to multiple data input circuits 150, each associated with a different DQ signal 198. In another embodiment, there are multiple gating circuits 140. Each gating circuit 140 is associated with a single DQ signal 198 and generates a respective gated DQS signal 142 for latching its associated DQ signal 198.

The data input circuit 150 uses the gated DQS signal 142 as a timing reference for latching or reading in the data on the DQ signals 198. In one embodiment the data input circuit 150 is a register or similar circuit. The data input circuit 150 may also delay the DQ signals 198 so that the strobe edges of the gated DQS signals 142 fall within the middle of the data eye for the DQ signals 198. The delay is nominally equal to the delay added by the strobe delay circuit 130 minus 0.5 UI, assuming no relative skew among DQ signals 198 due to system interconnect mismatches. There may be multiple data input circuits 150, each receiving a different DQ signal 198 and a shared gated DQS signal 142 for reading data from its associated DQ signal 198. Alternatively, each data input circuit 150 may receive a different DQ signal 198 and a different gated DQS signal 142.

Figure 2A:
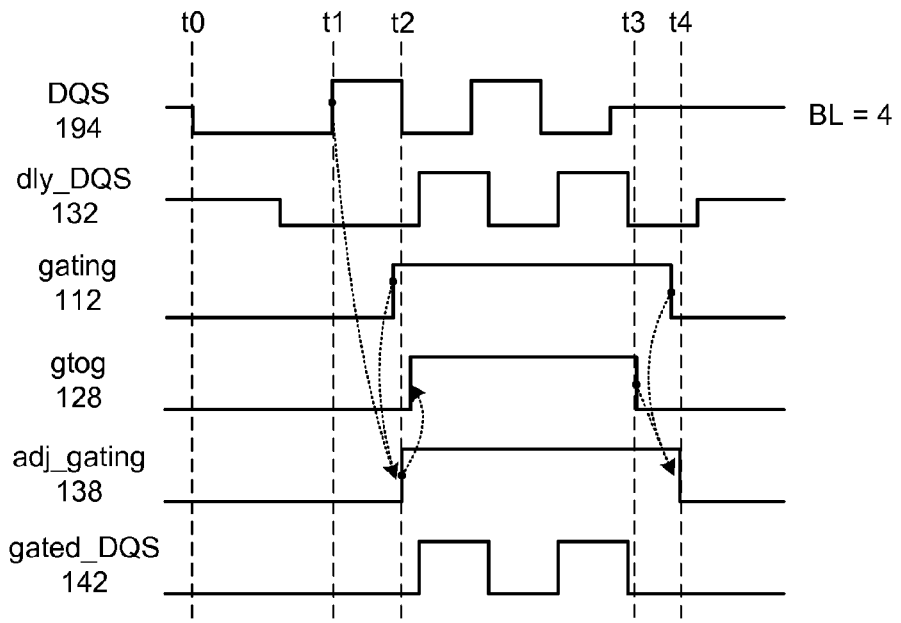
FIG. 2A is a timing diagram for the memory controller of FIG. 1, according to an embodiment.

The operation of the memory controller 20 is now described in greater detail by reference to FIGS. 2A, 2B, 3A and 3B. FIG. 2A is a timing diagram for the memory controller 20 of FIG. 1, according to an embodiment. In this embodiment, the delayed DQS signal 132 is delayed by slightly more than 1 UI in order to support a read gate window extension of 1 UI. The timing diagram includes waveforms for the DQS signal 194, the delayed DQS signal 132, the gating signal 112, the gate toggle signal 128, the adjusted gating signal 138, and the gated DQS signal 142. It is assumed for the purposes of this timing diagram that the burst length is 4 bits long.

Prior to time t0, the DQS signal 194 is in an undriven state and does not include any valid strobe edges. At time t0, the DQS signal 194 is de-asserted to begin the DQS pre-amble phase. At time t1, the DQS signal 194 is asserted with a rising strobe edge. Prior to time t2, gating signal 112 is asserted to indicate the beginning of the initial read window. The assertion of both the DQS signal 194 and the gating signal 112 causes the adjusted gating signal 138 to be asserted at time t2 to start the adjusted read window. In turn, the assertion of the adjusted gating signal 138 enables the counter circuit 124, which then asserts the gate toggle signal 128 after time t2.

Between time t2 and t3, the counter circuit 124 counts the number of strobe edges of the delayed DQS signal 132, which cause an internal counter value to be incremented. The counter circuit 124 counts to four because it is configured to operate with a burst length of four bits. In other embodiments, the counter circuit 124 may initialize with a count of 1 and start counting on the first falling edge of the delayed DQS signal 132 in order to provide the counter circuit 124 more time to exit the reset state. In other embodiments, the counter may count to a different number other than four (e.g. eight, sixteen, etc). At time t3, the counter circuit 124 determines that four strobe edges have occurred and de-asserts the gate toggle signal 128, which indicates that four strobe edges have been detected. Prior to time t4, the gating signal 112 is de-asserted to indicate the end of the initial read window. Both of these events cause the adjusted gating circuit 138 to be de-asserted to end the adjusted read window at time t4.

The resulting adjusting gating signal 138 includes an adjusted read window that starts at time t2 and ends at time t4. The adjusted read window represents a window of time during which the delayed DQS signal 132 is believed to have valid strobe edges. The adjusted gating signal 138 is used for gating the delayed DQS signal 132 to generate the gated DQS signal 142. Only portions of the delayed DQS signal 132 within the adjusted read window (e.g., between t2 to t4) are propagated to the gated DQS signal 142. Portions of the delayed DQS signal 132 outside of the adjusted read window, such as the indeterminate portion of the delayed DQS signal 132 prior to time t1, are filtered out.

Figure 2B:
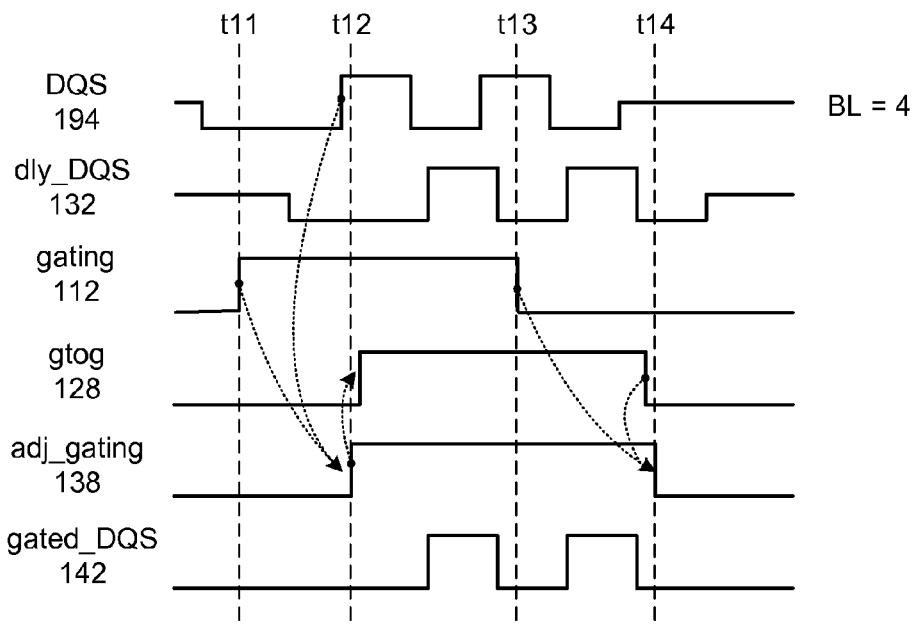
FIG. 2B is a timing diagram for the memory controller of FIG. 1 when the read window is early relative to the first strobe edge, according to an embodiment.

FIG. 2B is a timing diagram for the memory controller 20 of FIG. 1 when the initial read window is early relative to the first strobe edge, according to an embodiment. FIG. 2B is similar to FIG. 2A, except that the gating signal 112 is asserted during the pre-amble of the DQS signal 194 at time t11. The DQS signal 194 is asserted just before time t12. The assertion of both the DQS signal 194 and the gating signal 112 causes the adjusted gating signal 138 to be asserted at time t12. The assertion of the adjusted gating signal 138 then enables the counter circuit 124, which asserts the gate toggle signal 128 after time t12.

The adjusted gating signal 138 is not asserted at time t11, immediately after the gating signal 112 is asserted. At time t11, the delayed DQS signal 132 is still in an indeterminate state because the initial read window starts too early, for example, due to high frequency variations in the delay between the read request and the first strobe edge. If the adjusted gating signal 138 were asserted at time t11, it would cause the gated DQS signal 142 to have spurious strobe edges immediately after time t11, which in turn would cause the data input circuit 150 to read in trash data. It is not until time t12, when the delayed DQS signal 132 is in a known state, that the adjusted gating signal 138 is asserted to start the adjusted read window. Beneficially, this allows the initial read window to start after the first strobe edge of the DQS signal 194 (as in FIG. 2A) or early during the pre-amble of the DQS signal 194 (as in FIG. 2B). In one embodiment, the initial read window is extended by up to 1.5 UI into the pre-amble.

At time t13, the gating signal 112 is de-asserted to indicate the end of the initial read window. Prior to time t14, the gate toggle signal 128 is de-asserted after four strobe edges are counted. Both of these events cause the adjusted gating signal 138 to be de-asserted at time t14 to end of the adjusted read window. Note that adjusted gating signal 138 still remains asserted at time t13 even though gating signal 112 has been de-asserted. It is not until time t14 that adjusted gating signal 138 is de-asserted, which allows the last two strobe edges of the delayed DQS signal 132 to be properly gated onto the gated DQS signal 142.

The resulting adjusting gating signal 138 has an adjusted read window that extends from time t12 to time t14. All of the strobe edges of the delayed DQS signal 132 fall within the adjusted read window. The adjusted gating signal 138 is used for gating the delayed DQS signal 132 to generate the gated DQS signal 142. Only portions of the delayed DQS signal 132 within the adjusted read window (e.g., between t12 to t14) are propagated to the gated DQS signal 142. Portions of the delayed DQS signal 132 outside of the adjusted read window, such as the indeterminate portion of the delayed DQS signal 132 at time t1, are filtered out.

Figure 3A:
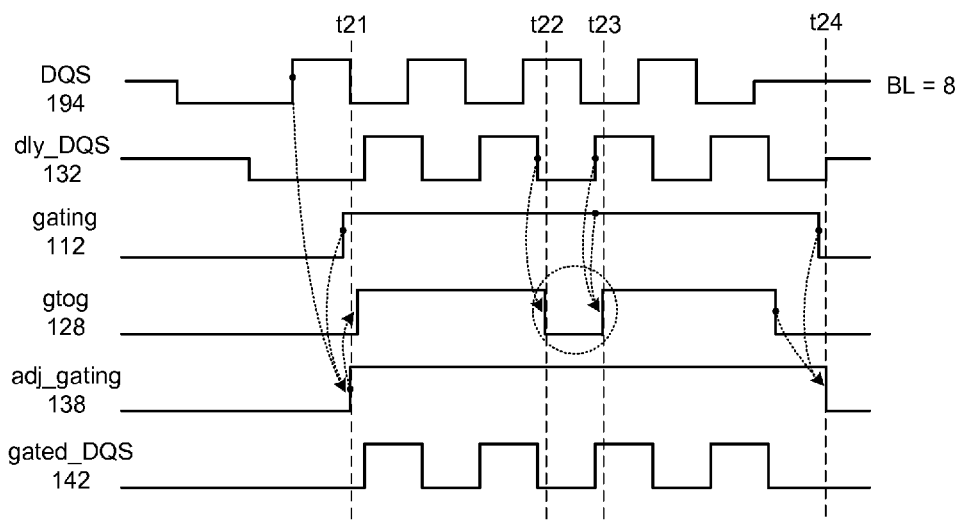
FIG. 3A is a timing diagram for the memory controller of FIG. 1, according to another embodiment.

FIG. 3A is a timing diagram for the memory controller 20 of FIG. 1, according to another embodiment. FIG. 3A is similar to FIG. 2A, except that the read burst length is now eight bits long. There are eight strobe edges on the DQS signal 194 that correspond to the longer burst length of eight bits.

At time t21, the adjusted gating signal 138 is asserted to start of the adjusted read window. The counter circuit 124 still only counts to four so it de-asserts the gate toggle signal 128 at time t22 after four strobe edges occur. Gating signal 112 remains asserted after time t22 so the adjusted gating signal 138 also stays asserted. At time t23 the counter circuit 124 restarts the count and asserts gate toggle signal 128. Prior to time t24, gating signal 112 and gate toggle signal 128 are both de-asserted, which causes the de-assertion of the adjusted gating circuit 138 to end the adjusted read window.

FIG. 3A thus shows that, even if the counter circuit 124 only counts to a fixed burst length (e.g. four), the gating adjustment circuit 120 can still be used for different predetermined burst lengths (e.g. four, eight, etc) without any changes.

Figure 3B:
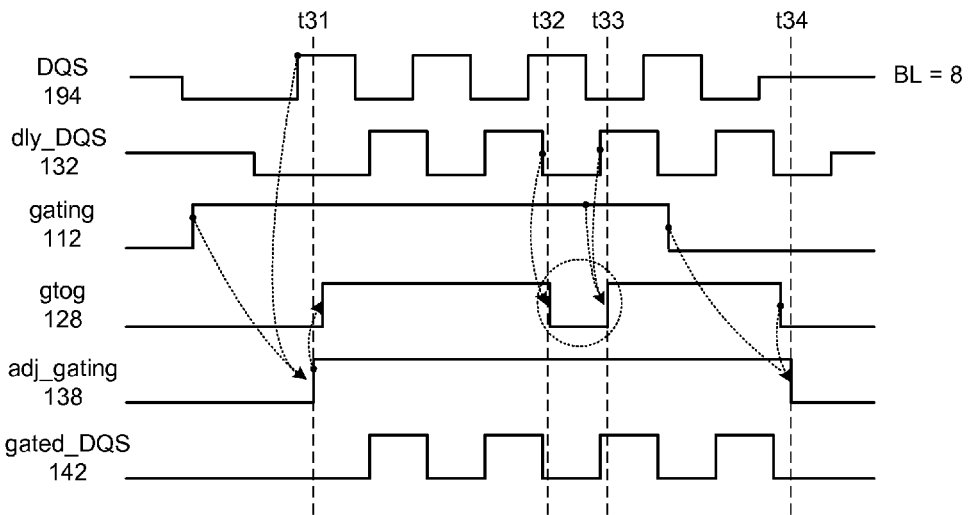
FIG. 3B is a timing diagram for the memory controller of FIG. 1 when the read window is early relative to the first strobe edge, according to another embodiment.

FIG. 3B is a timing diagram for the memory controller 20 of FIG. 1 when the initial read window is early relative to the first strobe edge, according to another embodiment. FIG. 3B is similar to FIG. 2B, except that the read burst length is now eight bits long. Referring to FIG. 3B, there are eight strobe edges on the DQS signal 194 that correspond to the longer burst length of eight bits.

At time t31, the adjusted gating signal 138 is asserted to start the adjusted read window. The counter circuit 124 still only counts to four so it de-asserts the gate toggle signal 128 at time t32 after four strobe edges occur. Gating signal 112 is still asserted after time t32 so the adjusted gating signal 138 also stays asserted. At time t33 the counter circuit 124 restarts counting and asserts gate toggle signal 128. Prior to time t34, gating signal 112 and gate toggle signal 128 are both de-asserted, which causes the de-assertion of the adjusted gating circuit 138 at time t34 to end the adjusted read window.

Upon reading this disclosure, those of skill in the art may appreciate still additional alternative designs for a read strobe gating mechanism. Thus, while particular embodiments and applications of the present disclosure have been illustrated and described, it is to be understood that the disclosure is not limited to the precise construction and components disclosed herein. Various modifications, changes and variations which may be apparent to those skilled in the art may be made in the arrangement, operation and details of the method and apparatus of the present disclosure herein without departing from the spirit and scope of the disclosure as defined in the appended claims.

What is claimed is:

1. A memory controller, comprising:
    a control circuit to generate a gating signal indicative of a read window;
    a gating adjustment circuit to receive the gating signal and a timing reference signal for reading data and to generate an adjusted gating signal indicative of an adjusted read window based on the gating signal and the timing reference signal; and
    a gating circuit to generate a gated timing reference signal for reading data, the gated timing reference signal generated by gating a delayed version of the timing reference signal with the adjusted gating signal.

2. The memory controller of claim 1, wherein the gating adjustment circuit generates the adjusted gating signal to indicate a start of the adjusted read window responsive to both the gating signal indicating a start of the read window and assertion of the timing reference signal.

3. A memory controller comprising:
    a port to receive a timing reference signal for reading data;
    a control circuit to generate a gating signal indicative of a read window;
    a gating adjustment circuit to generate an adjusted gating signal indicative of an adjusted read window based on the gating signal and the timing reference signal; and
    a gating circuit to generate a gated timing reference signal for reading data, the gated timing reference signal generated by gating a delayed version of the timing reference signal with the adjusted gating signal,
    wherein the gating adjustment circuit generates the adjusted gating signal to indicate an end of the adjusted read window responsive to both the gating signal indicating an end of the read window and occurrence of a pre-determined number of edges of the delayed version of the timing reference signal.

4. The memory controller of claim 3, wherein the gating adjustment circuit includes:
    a counter circuit to count the edges of the delayed version of the timing reference signal and generate a toggle signal indicating whether a pre-determined number of the edges has been detected,
    wherein the adjusted gating signal is de-asserted responsive to both the gating signal indicating the end of the read window and the toggle signal indicating detection of the pre-determined number of the edges.

5. The memory controller of claim 3, wherein the pre-determined number of edges corresponds to a data burst length.

6. The memory controller of claim 3, wherein the pre-determined number of edges is adjustable for different data burst lengths.

7. The memory controller of claim 1, further comprising:
    a delay circuit to generate the delayed version of the timing reference signal by delaying the timing reference signal by at least half a unit interval.

8. The memory controller of claim 1, wherein the timing reference signal for reading data is a data strobe signal.

9. The memory controller of claim 1, further comprising:
    a first data input circuit to read data by using the gated timing reference signal as a timing reference for a first data signal.

10. The memory controller of claim 9, further comprising:
    a second data input circuit to read data by using the gated timing reference signal as a timing reference for a second data signal.

11. A method of operation in a memory controller, comprising:
    generating a gating signal indicative of a read window;
    receiving, at a gating adjustment circuit, the gating signal and a timing reference signal for reading data;
    generating, at the gating adjustment circuit, an adjusted gating signal indicative of an adjusted read window based on the gating signal and the timing reference signal; and
    generating, at a gating circuit, a gated timing reference signal for reading data by gating a delayed version of the timing reference signal with the adjusted gating signal.

12. The method of claim 11, wherein the adjusted gating signal is generated to indicate a start of the adjusted read window responsive to both the gating signal indicating a start of the read window and assertion of the timing reference signal.

13. A method of operation in a memory controller, comprising:
    receiving a timing reference signal for reading data;
    generating a gating signal indicative of a read window;
    generating an adjusted gating signal indicative of an adjusted read window based on the gating signal and the timing reference signal, wherein the adjusted gating signal is generated to indicate an end of the adjusted read window responsive to both the gating signal indicating an end of the read window and occurrence of a pre-determined number of edges of a delayed version of the timing reference signal; and
    generating a gated timing reference signal for reading data by gating the delayed version of the timing reference signal with the adjusted gating signal.

14. The method of claim 13, further comprising:
    counting the edges of the delayed version of the timing reference signal;
    generating a toggle signal indicating whether a pre-determined number of the edges has been detected,
    wherein the adjusted gating signal is de-asserted responsive to both the gating signal indicating the end of the read window and the toggle signal indicating detection of the pre-determined number of the edges.

15. The method of claim 13, wherein the pre-determined number of edges corresponds to a data burst length.

16. The method of claim 13, wherein the pre-determined number of edges is adjustable for different data burst lengths.

17. The method of claim 11, further comprising:
generating the delayed version of the timing reference signal by delaying the timing reference signal by at least half a unit interval.

18. The method of claim 11, wherein the timing reference signal for reading data is a data strobe signal.

19. The method of claim 11, further comprising:
reading data by using the gated timing reference signal as a timing reference for a first data signal.

20. The method of claim 19, further comprising:
reading data by using the gated timing reference signal as a timing reference for a second data signal.

* * * * *